United States Patent [19]

Harchol

[11] 4,056,726
[45] Nov. 1, 1977

[54] COAXIAL GAMMA RAY DETECTOR AND METHOD THEREFOR

[75] Inventor: Micha Harchol, Kendall Park, N.J.

[73] Assignee: Princeton Gamma-Tech, Inc., Princeton, N.J.

[21] Appl. No.: 618,357

[22] Filed: Oct. 1, 1975

[51] Int. Cl.$^2$ .......................... G01T 1/24; H01L 29/06
[52] U.S. Cl. .................................... 250/370; 250/371; 357/55
[58] Field of Search ................... 250/370, 371; 357/55

[56] References Cited

U.S. PATENT DOCUMENTS

| | | | |
|---|---|---|---|
| 3,210,560 | 10/1965 | Stehney | 357/55 X |
| 3,374,124 | 3/1968 | Tavendale | 357/55 X |
| 3,524,985 | 8/1970 | Sayres | 250/371 |
| 3,546,459 | 12/1970 | Higatsberger et al. | 250/370 |
| 3,691,389 | 9/1972 | Ellis et al. | 357/55 X |

Primary Examiner—Archie R. Borchelt
Attorney, Agent, or Firm—Bacon & Thomas

[57] ABSTRACT

A coaxial gamma ray detector is fabricated using intrinsic semiconductor material in a geometry whereby full depletion of electrical carriers is prevented within a small region proximate the point of electrical contact thereby allowing greater biasing potentials across the detector and, consequently, providing reduced electronic noise and increased energy resolution.

43 Claims, 7 Drawing Figures

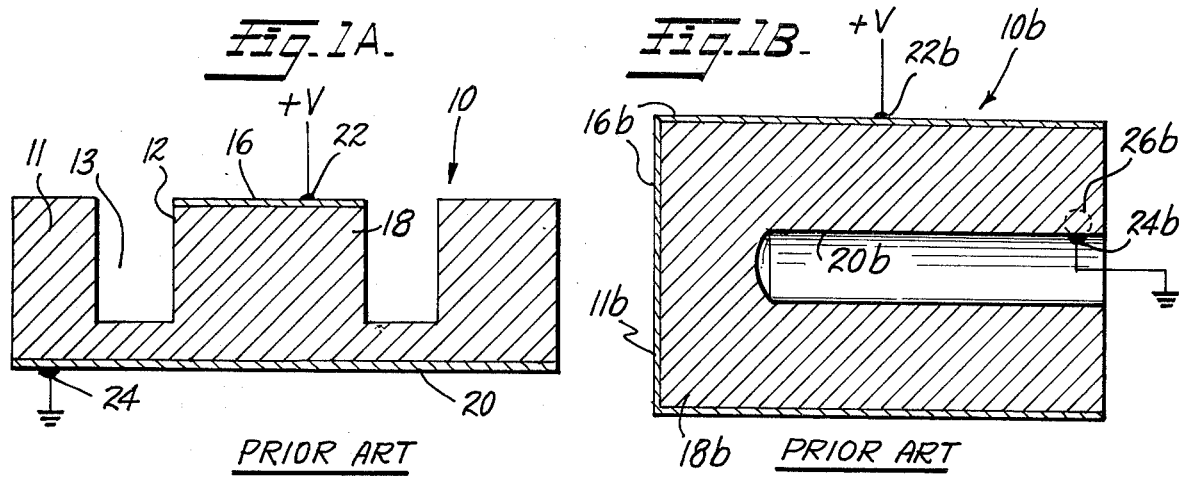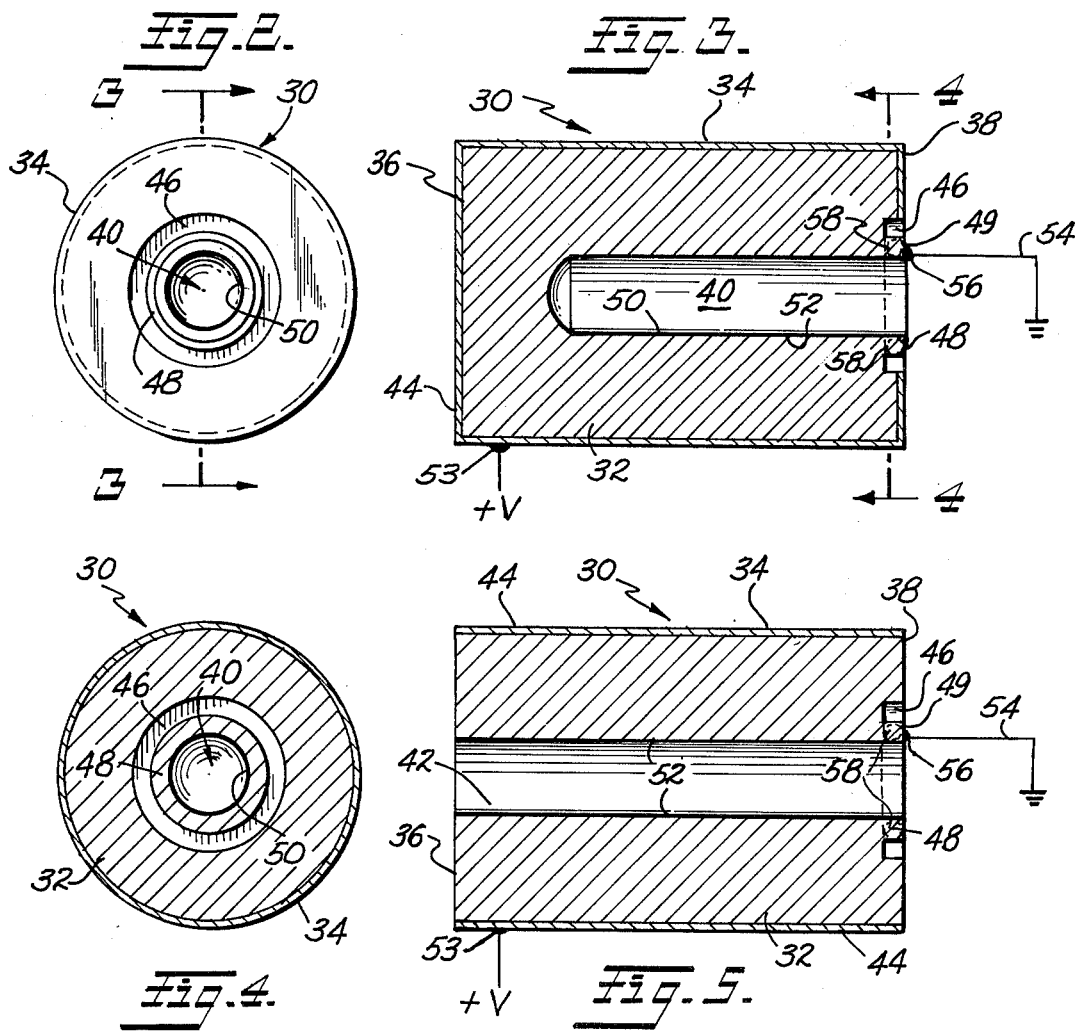

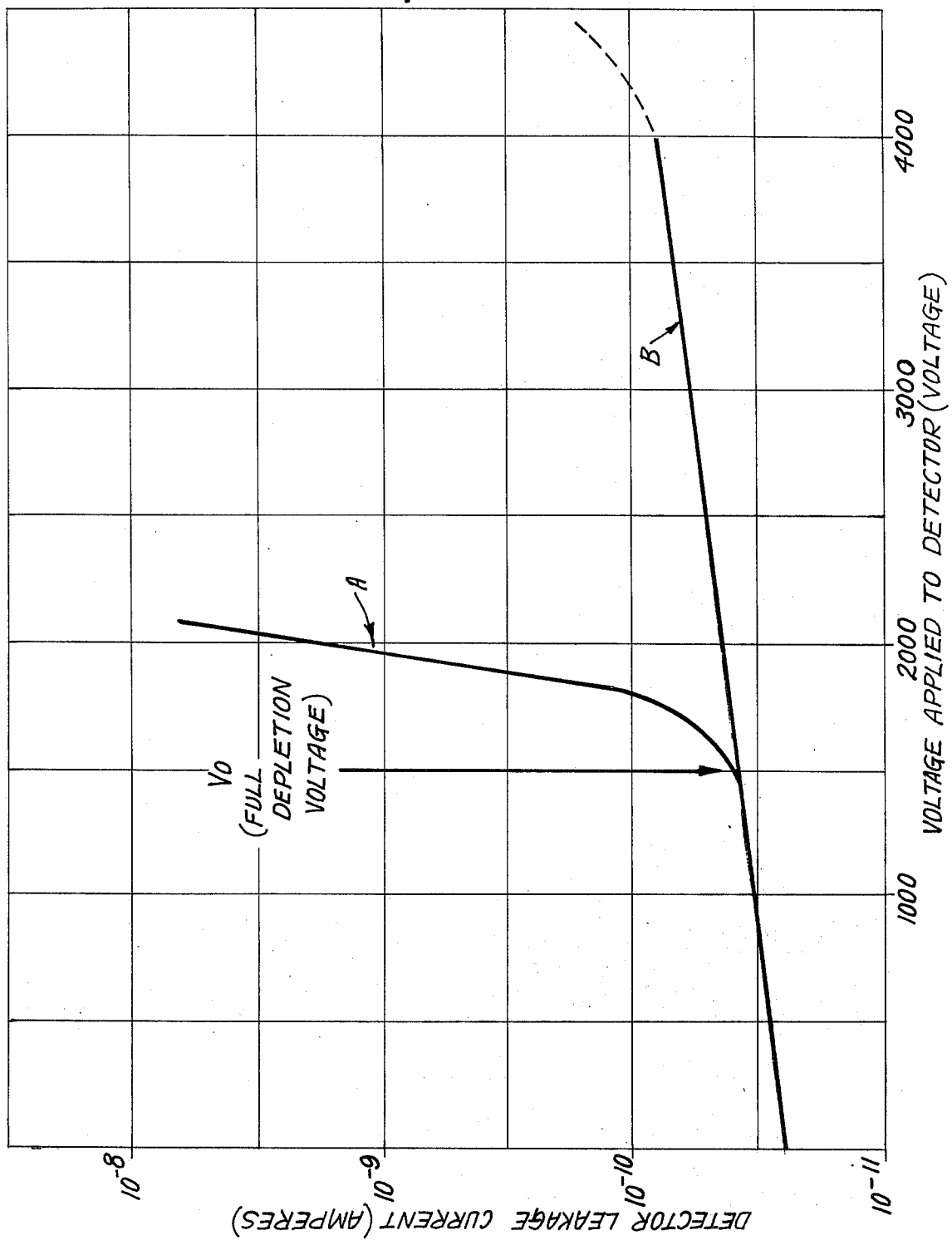

COAXIAL GAMMA RAY DETECTOR AND METHOD THEREFOR

BACKGROUND OF THE INVENTION

1. Field of the Invention

The present invention relates generally to solid state radiation detectors and, more particularly, to coaxial germanium gamma ray detectors. The present invention also relates to methods therefor.

2. Background of the Prior Art

The prior art has long recognized the utility of solid state radiation detectors; the most notable efforts in this area resulting in various techniques for the fabrication of P-I-N semiconductors. Fundamentally, these P-I-N structures provide an intermediate region of intrinsic or impurity-compensated semiconductor material sandwiched between P and N layers. Upon application of a reverse bias, depletion of electrical charge carriers within the intrinsic or impurity-compensated region yields an active zone for the detection of charged particles and x-ray and gamma ray photons. The event of impingement of such radiation is manifested by an ionization of the material within the intrinsic zone and the concomitant sweeping away and collection of resultant charges. By proper association of the detector with appropriate measuring equipment, such as, for example, pulse height analyzers, information regarding both the number of events and the distribution of energies is achievable.

The aforesaid ionization accompanying the event varies significantly with respect to the source of ionizing radiation. For example, many detectors which are suitable for interpreting charged particle radiation, such as alpha particle events, are wholly unsuitable for analysis of gamma and x-ray photons, which require much larger detectors with exceedingly lower noise characteristics.

The detection of x-ray or gamma ray photons is further complicated by the fact that the radiation may be absorbed or attenuated by various, diverse mechanisms. The most notable photon-electron interactions which give rise to indications of such events in radiation detectors are (1) ejection of photo-electrons, (2) Compton scattering, and (3) pair production or (4) pair annihilation. Additionally, bremsstrahlung radiation may affect variations in output signals from solid state detectors. Of lesser consequence to absorption and/or attenuation of an incident beam are (1) fluorescence, coherent scattering by (2) electrons and (3) atoms, and (4) Compton recoil electrons. For a more complete exposition regarding these interactions and the manner in which solid state radiation detectors respond thereto, see U.S. Pat. No. 3,524,985 to Sayres and the text *Elementary Modern Physics*, 2nd. ed., Allyn and Bacon, Boston, 1968.

Not all of the aforementioned mechanism account for the creation of charge carriers in the detector material. Some of the foregoing interactions will merely decrease the overall energy of the beam without yielding a charge carrier. Yet others will account for the ejection of an electron which will be manifested as an electrical impulse indicative of the event. Moreover, certain of the aforenoted processes may work in seriatim yieldingelectrons which, as they are being swept from the detector will subsequently interact to produce photons which may continue along with or without further interaction. For example, a scattered gamma ray following a Compton event may itself interact within the detector. Following a pair-production event, the positron may annihilate with an electron producing two quanta of 511 keV; one or both of these photons may then interact within the detector. Whatever the order of events, if all of the energy of the incident gamma ray is deposited in the active volume of the detector, a signal will be obtained which contributes to the full energy peak or "photopeak" in the pulse-height spectrum. The size and geometry of the detector, as well as the energy of the incident gamma ray, as effected by the electric field within the detector, play an important role in determining (1) the number of events which appear in the full-energy peak for a given incident flux, and (2) the energy resolution of the detector.

In the study and analysis of gamma or x-ray radiation from various sources, one finds gamma rays of various energies and intensities. Because the resulting pulse spectrum from a single gamma ray is itself complex, the resulting spectrum from a source of many gamma rays is even more complex. Thus, the analysis of a spectrum of gamma rays is often difficult and ambiguous with numerous competing interactions giving rise to undesirable background as well as a loss of much useful information should the detector inherently lack sufficient energy resolution.

Obviously, if the detector lacks resolution, for any reason, for portions of the incident spectrum or secondary interactions, associated analytical equipment will not generally be capable of remedial correction in the first instance. Therefore, it is manifestly important that the semiconductor detector possesses great resolution to photon energy without itself contributing to excessive noise. As the resolution and efficiency of these devices are dependent both upon the volume of the active, intrinsic region and the biasing voltage therefor, it is desirable to have each of these factors as large as possible. If the application of a high bias voltage causes excessive leakage current, however, the resolution will suffer.

With regard to the volume of the active region, the prior art is replete with methods and devices to enlarge the active region. The initial step forward was provided by Pell, U.S. Pat. No. 2,957,789 disclosing the lithium drifting of semiconductor material. This technique has been perfected in the prior art to yield P-I-N structures having appropriately large intrinsic zones.

The drifting of lithium in, for example, germanium detectors is now a well known technique to compensate for impurities to yield an n-type region. Generally, lithium drifting techniques are described in U.S. Pat. Nos. 3,225,198, 3,378,414, 3,329,538, 3,472,711, 3,310,443, and No. 3,374,124.

While the prior art has been successful in the fabrication of P-I-N structures having adequately large intrinsic zones and capable of tolerating large biasing voltages without excessive or runaway leakage currents, it has not yet been successful in achieving these results in P-N structures using high-purity germanium instead of lithium-drifting.

As a reverse bias voltage is applied to a P-N detector made from high-purity germanium a depletion zone resulting from the sweeping away of charge carriers will extend partially into the n-type region and partially into the p-type region. The extension of the depletion zone will be primarily into the region of higher purity, which for purposes of the discussion herein we assume to be the p-type region. As is usual in semiconductor devices, the roles of p-type and n-type regions may be interchanged with suitable alterations in the polarities of the charge carriers and the applied voltages. As the reverse bias voltage is increased the thickness of the depletion zone will increase until the surface of the zone becomes contiguous with the external surface of the detector. In a planar-geometry detector this surface is often called the rear surface, although in practice it is customary to orient the detector so that the so-called rear surface actually faces the incident flux of radiation which is to be measured. In a coaxial-geometry detector, depletion generally begins at the outer cylindrical surface, and the depletion zone will at some reverse bias voltage reach the inner surface of the detector. For both planar and coaxial detectors the voltage which is required to deplete the detector throughout to the external surface as hereabove described, is termed the "full depletion voltage" and the condition existing in the detector under the effect of reverse bias equal to or greater than the full depletion voltage is termed "full depletion."

It is important to the successful performance of coaxial detectors made from high purity germanium that such detectors be operated with a reverse bias voltage that is substantially higher than the full depletion voltage. If they are not so operated the electrical field in the region proximate to the external surface at the boundary of the depletion zone is quite weak and the electrical carriers which are generated in this region by the interaction of photons with the detector will be poorly collected and the energy resolution from such events will be poor.

In order to permit the application of a reverse bias voltage higher than the full depletion voltage the usual practice in the prior art has been to apply to the external surface a thin coating of a metal having a sufficiently high work function to hinder or prevent the injection of electrical carriers into the detector at the point of electrical contact. In this manner some success has been achieved in applying a high reverse bias voltage without the undersirable effect of creating excessively high leakage currents which can cause electronic noise and degrade the energy resolution of the detector. To date, however, no totally effective technique has been devised.

The deficiencies in making satisfactory electrical contact with the detector have further ramifications. Any scratches in the metallic surface at the point of contact will provide a preferential conduction path and concomitant breakdown of electrical characteristics via injection of charge carriers. Even if it is possible to affix the contact to the detector in a scratch-free manner, mere vibration resulting from the operation of fans and the like in associated equipment is often sufficient to cause subsequent degradation at the point of contact.

Accordingly, the need exists to provide a radiation detector of high efficiency. Similarly, the need exists to provide such a detector capable of withstanding much higher reverse bias voltages than heretofore obtainable without resulting in breakdown or other deleterious manifestations by injection of charge carriers.

SUMMARY OF THE INVENTION

Therefore, it is a major object of the present invention to provide a radiation detector of high efficiency and energy resolution.

It is also a major object of this invention to provide a radiation detector capable of withstanding much higher reverse bias voltages than detectors known in the prior art.

It is yet another object of the present invention to provide a simple, highly efficient method for the fabrication of radiation detectors which are extremely sensitive to incident radiation and which do not exhibit tendencies toward injection at the point of electrical contact.

It is still a further object of the present invention to provide a method for the detection of gamma and/or x-ray radiation which employs a highly sensitive solid state detector.

Yet another object of the present invention is to provide a method for the detection of gamma and/or x-ray radiation whereby a solid state detector operates at reverse bias voltage levels much higher than those detectors of the prior art.

Still a further object of the present invention is the effective isolation of the contact region of the solid state detector from the active region thereof whereby the detector does not exhibit large stead-state leakage current characteristics.

Yet another object of the invention is to provide an efficient germanium gamma ray detector employing high purity intrinsic germanium at high reverse bias operating potential.

A further object of the invention is to provide a coaxial gamma ray detector of high efficiency operable at high reverse bias voltage levels with low leakage currents.

The above objects and advantages may be achieved by employing, preferably, ultra-pure semiconductor material for the fabrication of radiation detectors. Electrical impurity material is selectively diffused into an outer skin region of the semiconductor body which is fashioned in coaxial geometry. The provision of a thin neck or shoulder region provides a location for making electrical contact and precludes full depletion thereat. Consequently, reverse bias voltages many times greater than those of prior art devices can be obtained.

BRIEF DESCRIPTION OF THE DRAWINGS

FIG. 1A is a diagrammatic view of an exemplary planar radiation detector according to the prior art;

FIG. 1B is a diagrammatic view of an exemplary coaxial radiation detector according to the prior art;

FIG. 2 is an end elevational side view of a radiation detector according to a preferred embodiment of the present invention.

FIG. 3 is a vertical sectional view of the detector of FIG. 2, taken substantially along line 3—3 thereof;

FIG. 4 is a vertical transverse sectional view, taken on the line 4—4 of FIG. 3;

FIG. 5 is a vertical sectional view, similar to FIG. 3, showing a modification of the radiation of the radiation detector; and FIG. 6 is a graph of leakage current versus reverse bias comparing prior art detectors with those made in accordance with the present invention.

DETAILED DESCRIPTION OF THE INVENTION

In order to more fully elucidate upon the objects and advantages of the present invention, the following detailed description will be given in terms of various preferred embodiments, the same intended to be illustrative and in no way limitative.

FIGS. 1A and 1B diagrammatically depict solid state radiation detectors exemplary of prior art devices. FIG. 1A shows a cross-sectional view of a circular planar detector. The detector, designated generally as 10, comprises a semiconductor body 12 which, for purposes of explanation only, may be considered to be high purity germanium, containing of the order $10^{10}$ electrical impurities per $cm^3$. The conductivity type of such germanium may be p-type; for purposes of explanation only we assume it to be p-type. In order to create a p-n junction in the germanium for the purpose of permitting application of a reverse bias voltage and the resulting sweeping out of the free electrical carriers, a donor impurity is diffused into the semiconductor body 12 to form an n-type region 16 adjacent a p-type germanium region 18. The donor may be any of a large number of customary donor elements, such as lithium, phosphorus, arsenic, antimony, and others.

To the opposite face of the semiconductor blank 12 is applied a metallic coating 20 to serve as a convenient location for electrical contact with the detector. Metallic layer 20 may be applied by any one of a number of conventional techniques, including, but not limited to, vacuum evaporation, sputtering, plating, and the like. The metal chosen for layer 20 is typically gold, palladium, chromium, platinum or any other metal chosen for, amongst other reasons, a suitable work funtion. For the sake of clarity, coated layer 20 is greatly exaggerated in thickness. Electrical contact is made at the n-type layer and at the metal coating as shown at 22 and 24, respectively.

In operation, the device depicted in FIG. 1A is subjected to a reverse bias voltage through contact points 22 and 24. This reverse bias causes a sweeping away of charge carriers, electrons, and holes, to yield a depletion zone. The depletion zone will extend a short distance into the n-type region 16 and will proceed across the p-type region 18 until, at some critical value of reverse bias voltage, the depletion zone becomes contiguous with metallic layer 20.

At that point the depletion zone can move no further and any further increase in the value of reverse bias will cause the electrical field strength within the depletion zone to increase. Such an increase in the electrical field strength has the desirable effect of improving the collection of electrical carriers which may be produced by incident photons in the detector. Accordingly, it is important to the quality of performance of the detector for it to be operated under a reverse bias substantially higher than the full depletion voltage.

The prior art planar detector illustrated in FIG. 1A has a groove 13 surrounding the active region, or depletion zone 18. The groove 13 and the undepleted semiconductor material 11 surrounding it is provided for ease of cleaning and handling and for some limited protection of the surface of the depletion zone against either contamination or mechanical damage. In such prior art devices, the contact point 24 has been made near the periphery of the detector 10 inasmuch as the layer 20 is the "front" of the detector which is exposed to the incident radiation. In accordance with the principle of the instant coaxial detector, however, it appears that the groove and relative position of the contact point 24 would serve to sufficiently reduce the noise effect of injection electrons from the region of the contact 24. This beneficial feature appears to be unrecognized in prior art planar devices, and wholly lacking in prior art coaxial detector technology.

FIG. 1B shows a prior art coaxial detector corresponding generally to that disclosed in U.S. Pat. No. 3,374,124, and, for a more complete description of production methodology, that patent may be consulted as exemplary of these devices. Briefly, a donor element such as lithium is applied to the entire circumferential surface and one planar surface and diffused to yield an n-type region 16b. A core of n-type material corresponding in extent to bore 21b, may be drilled out as shown, and a metal coating 20b applied to the internal bore surface to facilitate the joining of contact point 24b.

The device of FIG. 1B operates similar to that of FIG. 1A. Again, assuming germanium is the semiconductor material, there will exist a depletion zone of germanium in which the electrical carriers are swept out. As reverse bias voltage is applied this depletion zone grows inward from the n-type layer 16b until at some value of the reverse bias the depletion zone's inner surface is contiguous with the surface of 20b of the bore 21b. If the voltage is further increased the work function of the metal coating 20b must be sufficiently high to prevent the injection of excess electrical carriers in order to prevent high reverse leakage currents which would ruin the energy resolution of the detector. A major problem with prior art coaxial detectors as exemplified in FIG. 1B arises from the need for making electrical contact at a point or region 24b where the germanium is fully depleted and where, if there is any applied reverse bias in excess of the full depletion voltage, there is a large local electrical field. Any mechanical-electrical contact applied at such a point or such a region can easily produce localized damage to the metal coating with a resultant breaking down of the surface potential barrier which prevents the injection of electrical carriers at 24b. The steady state response of leakage current versus reverse bias for a typical prior art coaxial detector is shown in FIG. 6 as curve A.

Since these prior art coaxial detectors are limited to relatively low values of reverse bias there are inherent limitations in the effective collection of electrical carriers which are produced by gamma or x-ray photons in such detectors, especially if the photons interact with the germanium in the vicinity of the core, where the fields are weakest. The result of this inherent limitation is a loss of energy resolution using the prior art detector. In order to overcome this inherent drawback of the prior art, the radiation detector of the present invention is constructed in such a fashion as to preclude full depletion of charge carriers at the point adjacent electrical contact thus allowing application of reverse bias voltages at least three times as great as prior art devices are capable of withstanding.

FIGS. 2–3 illustrate one embodiment of the present invention. The device is shown as being substantially cylindrical in configuration: however, it will be appreciated by the skilled artisan that other appropriate geometries may be employed and yet realize the objects and advantages of the present invention. By way of example, the detector, generally designated 30, is fabricated from ultra-pure or "intrinsic" semiconductor material 32. For purposes of the instant description, this material is germanium of exceedingly high purity having electrical impurity concentrations so low that lithium drifting to compensate the impurities is unnecessary. Such high purity germanium is commercially available as General Electric "HPG$_e$," and typically exhibits net uncompensated impurity concentrations ranging from $5 \times 10^9$ to 2

× $10^{10}$ cm$^{-3}$. However, such ultra-pure germanium has no heavily p-type core such as is present in the prior art lithium drifted coaxial germanium detector, and thus the resultant detector is highly susceptible to large runaway leakage currents once full depletion has been achieved. A modified and improved detector geometry is thus employed in the instant invention as shown in FIGS. 2–5. It is noted, however, that such a detector geometry may also be applied to other semiconductor materials as for example lithium drifted germanium detectors.

As shown in FIGS. 2–4, the cylindrical blank of ultra-pure germanium material is sectioned to appropriate dimensions (e.g. 45mm dia. and 4cm long) and, thus, defines a volume having a lateral, circumferential surface 34 and first and second transverse, planar surfaces 36 and 38, respectively. A recess 40 is formed along the longitudinal axis of the cylindrical blank. As shown in FIG. 3, this recess 40 may be a blind hole to yield a geometry analogous to prior art closed end coaxial lithium drifted germanium detectors. Alternatively, the recess 40 may extend through the surfaces 36 and 38 to provide a true coaxial geometry.

An electrical impurity material chosen as an electron donor is plated, evaporated, sputtered or otherwise coated upon the entire circumferential surface 34, entirely upon first planar surface 36 and partially upon second planar surface 38 in a pattern which will be described more fully hereinbelow. This electrical impurity material, for purposes of example only, may be lithium. The lithium may then be diffused according to any of the prior art techniques to yield a thin n-type region 44 (Approximately 0.5 to 1.0 mm, for example) corresponding to the surface areas coated therewith. An annular groove 46 is formed concentric about recess 40 and is machined to yield an annular neck or shoulder 48. Annular groove 46 is machined to a depth greater than the thickness of n-type region 44 and is typically of such a dimension that the groove is about 1 to 2 mm wide and approximately 2 mm deep. For clarity, these dimensions are shown enlarged in the figures.

The lithium material is applied to planar surface 38 in such a fashion that it terminates contiguous with the projected outer radius of annular groove 46 as shown in FIG. 3. Accordingly, that portion of planar surface 38 lying interiorly of the groove 46 is free from such electrical impurity. Therefore, the neck or shoulder 48 is of intrinsic material identical to semiconductor body 32. Selective regional depositing and diffusing of lithium may be achieved by any of a number of known techniques, e.g. masking. Application of lithium to the planar surface 38 results in increased ease of handling and protection of the germanium material as compared with prior art devices.

A metallic layer 50 is applied to the entire surface 52 of the recess 40. Application of this metallic layer may follow any of the prior art techniques to provide a uniform scratch-free surface. A small amount of this metallic coating or plating may extend onto the top surface 49 of shoulder or neck 48 to provide a point of electrical contact 56. Alternately, a point contact 56 may be made on surface 52 closely adjacent shoulder top contact 56 may be made on surface 52 closely adjacent shoulder top surface 49. A second point contact may be made at any convenient location along the n-type layer 44 as shown, for example, at 53.

In operation, initially the radiation detector depicted in FIGS. 2–4 operates analogously to the prior art devices. That is, upon application of a reverse bias, excess charge carriers are swept away to yield a depletion zone extending partially into the n-type region and proceeding entirely across the body of material 32 and, at some critical value, becomes contiguous with metallic layer 50.

While the detector of the present invention responds to applied reverse bias in a manner analogous to prior art devices for voltages approaching this critical value, i.e. $V_o$, the significance of response to voltages exceeding $V_o$ is a highly distinguishing feature of the instant invention. As noted above, the contact point or metal/semiconductor interface region of FIG. 1 is wholly depleted at reverse bias voltages equal to and greater than $V_o$. Consequently, even minor imperfections in the point of contact 24 will result in the injection of charge carriers which thereby results in a steady state leakage current as shown by curve A of FIG. 6. The precise geometry of the devices shown in FIGS. 2–4 totally eliminates the deficiencies of such response and permits application of reverse bias voltages up to about $3V_o$ before significant steady-state leakage current is observable.

Comparing the devices of FIG. 1 and FIG. 3, a region 58 is shown in the latter which corresponds to an undepleted region of the detector for a reverse bias voltage $V_o$. Because region 58 is partially shielded by groove 46 and because the pure intrinsic nature of shoulder 48, the electrical fields causing depletion in reverse bias operation are diminished in region 58, and thus depletion does not take place in region 58 at the normal depletion voltage $V_o$. As the voltage is increased above $V_o$, undepleted region 58 will shrink or fringe up neck 48. This undepleted region 58 will continue to shrink, but yet effectively isolate the contact point 56 up to at least about $3V_o$ before the detector begins to exhibit undesirable levels of steady-state leakage current.

Obviously, to fully realize the superior objects and advantages of the detector of the present invention, contact point 56 must be located at a point within the projected extend of undepleted region 58 in order to be effectively isolated thereby. While the contact point may be made internally of recess 40, (or 42 of FIG. 5), at a location adjacent neck 48, it has been found more convenient to extend metal coating 50 to shoulder surface 49 for application of the point contact thereto as shown in the drawings. The joining of lead 54 at contact point 56 is thus greatly facilitated, and also insures a positioning of the contact at a point whereby maximum isolation is achieved.

Even though this small region 58 is not fully depleted, the sensitivity of the device is not adversely effected since region 58 is a very small fraction of the total crystal volume. Not only is efficiency not diminished, the energy resolution is enhanced considerably due to the ability of the device to withstand reverse bias voltages of at least three times that which may be applied to prior art detectors.

FIG. 5 shows another embodiment of the invention similar to that of FIGS. 2–4. In FIG. 5 a true coaxial geometry detector is employed with recess 40 extending through surfaces 36 and 38. Additionally, the lithium diffused region 44 is shown extending only within the cylindrical surface region of detector 30 and not within the region adjacent surfaces 36 and 38. Again, however, the contact point 56 is preferably made on shoulder surface 49 although it may be made in inner surface 52 adjacent region 58 as before.

FIG. 6 graphically demonstrates the superior properties of the solid state radiation detector of the present invention. For the coaxial devices compared, full depletion corresponds to approximately 1500 volts reverse bias. Increasing this voltage above that value resulted in catastrophic, runaway leakage current in the prior art coaxial detector as evidenced by curve A. Contrariwise, the curve B of FIG. 6 corresponds to a device of the present invention and shows a small rise in leakage current for reverse bias voltages to 4000 volts. Beyond 4000 volts, it has been determined that this steady, but shallow, rise changes slope, but such a change is likewise much smaller than that exhibited in curve A and the detector is operable even at reverse bias values exceeding 4000 volts.

While the invention has now been described with reference to certain preferred embodiments, it will be appreciated by the skilled artisan that various other modifications, substitutions, omissions, or changes may yet be made without departing from the spirit thereof.

I claim:

1. A coaxial radiation detector comprising:
    a. a body of semiconductor material,
    b. a diffused region of electrical impurity material within said semiconductor material, said region extending to a surface of said semiconductor material,
    c. first means for making electrical contact with said diffused region,
    d. a metallic layer in contact with said semiconductor body,
    e. electrical conductor means connected to said metallic layer at a contact region thereof,
    f. said first means and said electrical conductor means adapted for connection to a source of electrical potential for forming a depletion zone within said semiconductor material, and
    g. means for isolating said contact region from said depletion zone.

2. A radiation detector as recited in claim 1 wherein said depletion zone extends through said semiconductor body substantially contiguous with a major portion of said metallic layer, and said contact region is in a non-depletion zone of said semiconductor body.

3. A radiation detector as recited in claim 2 wherein said contact region is formed by substantially a point contact between said electrical conductor and said metallic layer.

4. A radiation detector as recited in claim 1 wherein said semiconductor body is a cylindrical solid having a longitudinal recess therein, said recess extending through an end surface of said solid and said diffused region extending to the cylindrical surface of said solid, said metallic layer covering substantially the surface of said recess.

5. A radiation detector as recited in claim 4 wherein said means for isolating said contact region comprises:
    a. an annular shoulder on said end surface concentric with said recess and positioned between said recess and an annular groove concentric therewith, and
    b. said contact region positioned proximate said shoulder.

6. A radiation detector as recited in claim 5 wherein said metallic layer covers at least a portion of said shoulder surface and said contact region is positioned on said shoulder surface.

7. A radiation detector as recited in claim 6 wherein said diffused region extends adjacent a portion of said end surface radially larger than said groove and said diffused region extends adjacent the other end surface of said cylindrical solid.

8. A radiation detector as recited in claim 7 wherein said semiconductor body is intrinsic germanium.

9. A radiation detector as recited in claim 8 wherein said electrical impurity material is lithium.

10. A radiation detector as recited in claim 8 wherein said metallic layer is selected from the group consisting of gold, chromium, platinum and palladium.

11. A radiation detector as recited in claim 7 wherein said semicondutor body is ultra-pure germanium, substantially free of p-type impurities.

12. A radiation detector as recited in claim 7 wherein the depth of said groove is greater than the depth of said diffused region.

13. A radiation detector as recited in claim 12 wherein the depth of said groove is substantially smaller than the length of said cylindrical solid.

14. A radiation detector as recited in claim 4 wherein said diffused region extends to a region adjacent the end surfaces of said solid.

15. A radiation detector as recited in claim 5 wherein said recess extends through said cylindrical body, passing through both end surfaces thereof.

16. A radiation detector as recited in claim 15 wherein said semi-conductor body is intrinsic germanium.

17. A radiation detector as recited in claim 15 wherein said semiconductor body is ultra-pure germanium, substantially free of p-type impurities.

18. A radiation detector as recited in claim 16 wherein the depth of said shoulder is greater than the depth of said diffused region.

19. A radiation detector as recited in claim 18 wherein the depth of said groove is substantially smaller than the length of said cylindrical solid.

20. A gamma-ray radiation detector comprising:
    a. a cylindrical body of high purity intrinsic germanium,
    b. a diffused region of electrical impurity material covering at least the cylindrical surface of said body and extending within said body,
    c. first means for making electrical contact with said diffused region,
    d. second means for making electrical contact with said body,
    e. first and second means adapted for connection to a voltage source for reverse biasing said detector thereby forming a depletion zone within a major portion of said body, and
    f. means for isolating said depletion zone from said second means thereby preventing runaway leaking currents during full depletion, high reverse bias operations.

21. A gamma-ray radiation detector as recited in claim 20 wherein:
    a. said cylindrical body has a recess therein extending through one end surface of said body,
    b. said second means comprises an extended metallic region substantially along the inner surface of said recess and a localized contact region having a conductor attached thereto, and
    c. said means for isolating comprises means for positioning said contact region adjacent said end surface of said body proximate said recess and means for diminishing the magnitude of electrical fields causing depletion adjacent said contact region.

22. A gamma-ray radiation detector as recited in claim 21 wherein said means for diminishing the magnitude of said depletion causing electrical fields comprises an annular shoulder on said one end surface concentric with said recess and radially interior of a concentric annular groove.

23. A gamma-ray radiation detector as recited in claim 22 wherein sid recess extends through said cylindrical body.

24. A gamma-ray radiation detector as recited in claim 22 wherein said diffused region extends adjacent said one end surface of said body radially exterior of said groove and said diffused region further extends adjacent the other end surface of said body.

25. A gamma-ray radiation detector as recited in claim 24 wherein said impurity material is lithium.

26. A method for fabricating a solid state radiation detector from a semiconductor body having a lateral surface and first and second opposing planar surfaces, said detector possessing high sensitivity and being capable of withstanding high reverse bias voltage without exhibiting catastrophic, steady-state leakage current, comprising the steps of:
   a. forming a recess along the longitudinal axis of said semiconductor
   b. depositing an electrical impurity materialf selectively upon said lateral surface and said planar surfaces in a pattern defining an impurity-free region on said first planar surface exteriorally concentric and adjacent to said recess;
   c. diffusing said electrical impurity material into said semiconductor body to yield an outer impurity region corresponding in extent to the area of said depositing and in penetration to a thickness substantially less than the overall thickness of said body;
   d. forming an annular groove in said first planar surface exteriorly concentric of said recess in the space between said recess and said impurity region, the depth of said groove being at least equal to the thickness of said outer impurity region, said groove defining a shoulder of intrinsic semiconductor material intermediately concentric said recess and said groove;
   e. depositing a layer of electrically-conductive material at least upon the internal surface of said recess; and
   f. providing a first electrical contact to said outer impurity region and a second electrical contact adjacent said shoulder.

27. The method of claim 26, wherein said step of forming said recess consists of forming a blind hole extending from said first planar surface, along said longitudinal axis, and terminating at a location intermediate said first and second planar surfaces.

28. The method of claim 26, wherein said step of forming said recess consists of forming a hole entirely through said body, extending from said first planar surface to said second planar surface.

29. The method of claim 26, wherein said step of depositing electrical impurity material in a pattern consists of depositing said electrical impurity material on:
   a. the entirety of said lateral and said second planar surfaces; and
   b. the outer, peripheral portion of said first planar surface.

30. The method of claim 29, wherein said step of depositing electrical impurity material consists of depositing electron donor material.

31. The method of claim 30, wherein said depositing of said electron donor material consists of depositing lithium.

32. The method of claim 30, wherein said depositing step consists of depositing lithium on germanium.

33. The method of claim 26, wherein said step of depositing a layer of electrically-conductive material upon the surface of said recess consists of depositing a metal.

34. The method of claim 33, wherein said step of depositing a metal consists of depositing a metal selected from the group comprising gold and palladium.

35. The method of claim 34, further comprising the step of depositing said metal upon an end surface portion of said shoulder.

36. The method of claim 35, wherein said second electrical contact is provided on said end surface portion of said shoulder.

37. A method for detecting electromagnetic radiation emanating from a radiative source comprising the steps of:
   a. applying a reverse bias voltage across a solid state radiation detector formed from a semiconductor material having:
      i. a substantially thin impurity region selectively diffused within the surface of said semiconductor material in a pattern defining an impurity-free region;
      ii. a recess along the longitudinal axis of said detector;
      iii. an annular groove exteriorly concentric of said recess, said groove having an outer diameter coincident with the diameter of said impurity-free region, said groove further defining a shoulder of intrinsic semiconductor material intermediately concentric said recess and said groove; and,
      iv. a substantially thin layer of electrically-conductive material coated upon the internal surface of said recess;
   said reverse bias applied to electrical contact points, one of said contact points located on said electrical impurity region and another of said contact points located on said electrically-conductive material adjacent said shoulder;
   b. forming a depletion zone devoid of free electrical carriers within a region intermediate said electrical impurity region and said electrically-conductive material;
   c. allowing radiation from said source to impinge upon said detector whereby charge carriers are generated within said depletion zone thereby giving rise to an electrical signal; and,
   d. applying said electrical signal to analytical equipment to determine the characteristics of said radiative source.

38. The method of claim 37, wherein said step of forming the depletion zone consists essentially of adjusting the reverse bias voltage to cause the depletion zone to extend from a first, interior surface substantially contiguous with the interface between the electrical impurity region and semiconductor material to a second interior surface substantially contiguous with the surface of the recess, the terminus of the depletion zone defining a substantially undepleted zone within the shoulder.

39. A method of increasing the sensitivity of the active depletion zone during operation of a coaxial gamma ray detector without producing large runaway leakage currents comprising the steps of:

forming a first electrical contact with an inner metallic layer at a region removed from the detector active depletion zone, forming a second electrical contact with an outer impurity zone; and applying a reverse bias voltage between said first and second contacts.

40. A method as recited in claim 39 wherein said reverse bias voltage is in the range between 0 and 4,000 volts.

41. A method as recited in claim 39 wherein said reverse bias voltage is in the range between 1,500 and 3,500 volts.

42. A method as recited in claim 39 wherein said reverse bias voltage is approximately 3,000 volts and said detector leakage current is less than $10^{-10}$ amperes.

43. A method as recited in claim 39 wherein said reverse bias voltage is greater than said full depletion voltage $V_o$.

* * * * *